United States Patent [19]

Masumura et al.

[11] Patent Number: 5,759,087
[45] Date of Patent: Jun. 2, 1998

[54] METHOD FOR INDUCING DAMAGE FOR GETTERING TO SINGLE CRYSTAL SILICON WAFER

[75] Inventors: Hisashi Masumura; Masami Nakano; Hideo Kudo, all of Nishi-shirakawa-gun, Japan

[73] Assignee: Shin-Etsu Handotai Co., Ltd., Tokyo, Japan

[21] Appl. No.: 435,656

[22] Filed: May 5, 1995

[30] Foreign Application Priority Data

May 24, 1994 [JP] Japan .................. 6-109360

[51] Int. Cl.⁶ .................................. H01L 21/304
[52] U.S. Cl. ................. 451/41; 451/36; 437/12; 148/33.2
[58] Field of Search .................. 451/36, 41, 285, 451/287, 288; 437/228, 10, 11, 12, 939; 156/645.1, 636.1; 257/610, 611; 148/33, 33.2, 33.3

[56] References Cited

U.S. PATENT DOCUMENTS

| | | | |
|---|---|---|---|
| 4,587,771 | 5/1986 | Buchner et al. | |
| 4,954,189 | 9/1990 | Hahn et al. | 437/12 |
| 4,983,650 | 1/1991 | Sasaki | 524/27 |
| 5,006,475 | 4/1991 | Robbins et al. | 437/10 |
| 5,051,375 | 9/1991 | Sakata et al. | 437/10 |
| 5,064,683 | 11/1991 | Poon et al. | 427/39 |
| 5,223,734 | 6/1993 | Lowrey et al. | 257/401 |
| 5,424,224 | 6/1995 | Allen et al. | 437/10 |
| 5,539,245 | 7/1996 | Imura et al. | 257/610 |

*Primary Examiner*—Eileen P. Morgan
*Attorney, Agent, or Firm*—Oliff & Berridge, PLC

[57] ABSTRACT

A method for inducing damage for gettering to the rear surface of a single crystal silicon wafer by polishing the rear surface, which can provide a good gettering effect to the wafer and can also depress dusting characteristics of the rear surface of the wafer, is disclosed. The method comprises the steps of; moving the wafer on an abrasive cloth relatively, and supplying an abrasive liquid having a pH in the range of 4–9 which contains silica particles having an average diameter in the range of 0.1–10 μm as abrasive grains, between the wafer and the abrasive cloth.

22 Claims, 6 Drawing Sheets

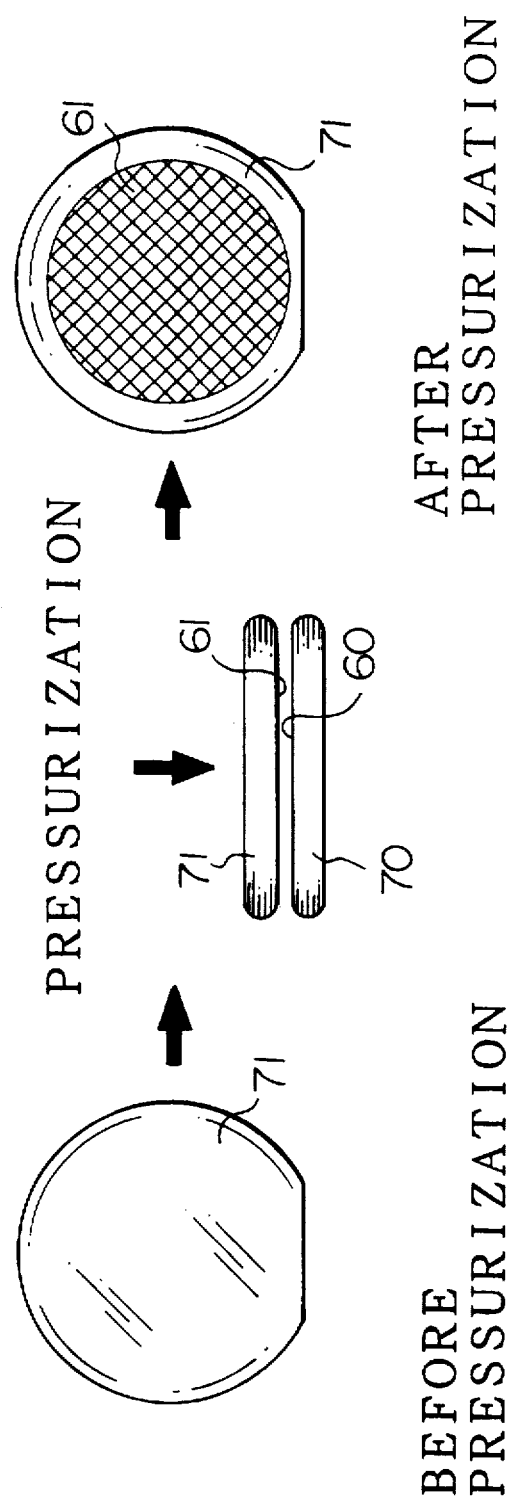

METHOD FOR INDUCING DAMAGE FOR GETTERING TO SINGLE CRYSTAL SILICON WAFER

BACKGROUND OF THE INVENTION

1. Field of the Invention

The present invention relates to a method for inducing damage for gettering to a single crystal silicon wafer (herein after, it may be simply referred to a wafer) which can provide a good gettering effect to the wafer and can also depress dusting characteristics of the rear surface of the wafer.

2. Description of Related Art

In a process for fabricating semiconductor devices, a wafer is subjected to various heat-treatments during which various kinds of crystal defects are introduced by oxygen, carbon, heavy metal impurities, and the like, which exist in the crystal. Because these defects are generated also on the wafer surface region and in the vicinity thereof, such defects cause larger leakage currents and lowering the manufacturing yield of devices and degrade device operation.

However, crystal microdefect or damage have a function which captures to fix impurities exerting adverse effect on the device operation or which captures point defects or the like which relate to defect occurrence, therein. This function is called gettering. The former is called extrinsic gettering (hereinafter, referred to EG), and the latter is called intrinsic gettering (hereinafter, referred to IG).

A method in which damage is mechanically induced on the rear surface of the wafer by high-pressure jets of $SiO_2$ particles or the like, and distortion, e.g., stacking faults, dislocations or the like which are generated during heat treatments, is used as a gettering source; or another method in which a poly-crystalline silicon layer or a $Si_3N_4$ layer is deposited on the rear surface of a wafer, and distortion, e.g., stacking faults or dislocations which are generated on the boundary between the deposited layer and the wafer to be a substrate, distortion which is generated on grain boundaries in a polycrystal of the deposited layer, or the like, are used as a gettering source; are known as a method for providing the EG to the wafer.

The gettering effect becomes larger as the magnitude of the formed distortion is larger. A method for measuring surface density of surface defect (hereinafter, referred to surface defect density), e.g., thermal oxidation stacking faults or dislocations which can be observed by carrying out a thermal oxidation treatment of the wafer at a temperature of about 1100° C. and thereafter carrying out a chemical selective etching (Secco-etching), is known as a method for evaluating the magnitude of the formed distortion.

According to the method in which damage is mechanically induced on the rear surface of the wafer by high-pressure jets of $SiO_2$ particles or the like, the limit of surface defect density which can be generated is not much exceeding $10^6$ $cm^{-2}$, and there is a problem of much dusting from the portion on which the damage was induced. According to the method in which a poly-crystalline silicon layer or a $Si_3N_4$ layer is deposited on the rear surface of a wafer, there is a problem of high costs required.

SUMMARY OF THE INVENTION

The present invention was developed in view of the above-described conventional problems. An object of the present invention is to provide a method for inducing damage for gettering to a single crystal silicon wafer, which can stably generate surface defects higher than that of conventional method, which are useful for gettering contamination with heavy metals during a process for fabricating semiconductor devices, and which can depress dusting characteristics of the rear surface of the wafer.

In accordance with one aspect of the present invention, the method for inducing damage for gettering to the rear surface of a single crystal silicon wafer by polishing the rear surface, comprises the steps of; moving the wafer on an abrasive cloth relatively, and supplying an abrasive liquid having a pH in the range of 4–9 which contains silica particles having an average diameter in the range of 0.1–10 µm as abrasive grains, between the wafer and the abrasive cloth.

Such a method enables stable generation of surface defects having a high density of approximately up to $10^7$ $cm^{-2}$, and is useful for gettering contamination with heavy metals during a process for fabricating semiconductor devices, and can depress dusting characteristics of the rear surface of the wafer.

The lower limit of the average diameter of silica particles is 0.1 µm, preferably 0.5 µm, more preferably 0.6 µm. When the average diameter is less than 0.1 µm, it is hardly to induce damage on the rear surface of the wafer. The upper limit of the average diameter of silica particles is 10 µm, preferably 4.0 µm, more preferably 1.0 µm. When the average diameter is more than 10 µm, scratches or cracks other than the damaged layer are apt to be formed during processing.

The lower limit of the pH value of the abrasive liquid is 4, preferably 6, more preferably 7. When the pH value is less than 4, silica particles dispersed in the aqueous liquid flocculate. The upper limit of the pH value of the abrasive liquid is 9. When the pH value is more than 9, formation of the damaged layer by polishing is prevented because a chemical etching simultaneously functions on the rear surface of the wafer during polishing.

Preferably, the abrasive liquid comprises water. The pH of the abrasive liquid may be adjusted by using a diluted hydrochloric acid or an aqueous ammonia.

The material for the abrasive cloth is not limited to a specific one. Polyurethane foams, polyesters, nonwoven fabrics or the like may be used. Preferably, polyurethane foams are used.

In accordance with another aspect of the present invention, the method for inducing damage for gettering to the rear surface of a single crystal silicon wafer by polishing the rear surface, comprising the steps of; rotating a rotary plate having an abrasive cloth attached thereon, rotating the wafer on the abrasive cloth so that the wafer can move on the abrasive cloth relatively, and supplying an abrasive liquid having a pH in the range of 4–9 which contains silica particles having an average diameter in the range of 0.1–10 µm as abrasive grains, between the wafer and the abrasive cloth.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6 is a view for explaining the steps of a method for evaluating the dusting characteristics of the rear surface of the wafer.

PREFERRED EMBODIMENT OF THE INVENTION

A preferred embodiment of the method for inducing damage for gettering according to the present invention will be explained with reference to the drawings.

Figure 1:
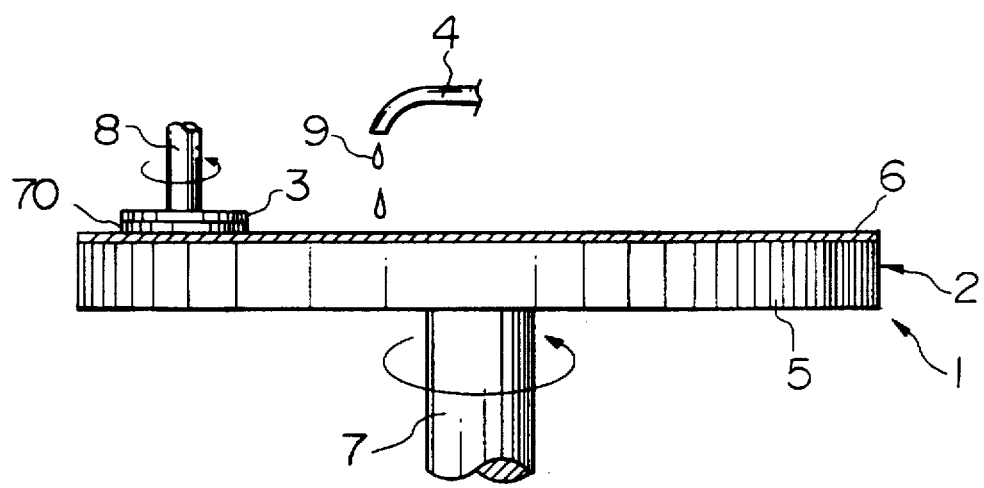
FIG. 1 is an elevational view of an apparatus for carrying out the method according to an embodiment of the present invention.

FIG. 1 shows an apparatus 1 for inducing damage for gettering to the rear surface of a single crystal silicon wafer 70, to carry out an embodiment according to the method of the present invention.

In FIG. 1, the apparatus 1 comprises a rotary table assembly 2, a rotary wafer carrier 3, and an abrasive liquid supplying member 4. The rotary table assembly 2 comprises a rotary table 5 and an abrasive cloth 6 adhered on the upper surface of the rotary table 5. The rotary table 5 can rotate on a shaft 7 at a predetermined rotation speed by a driving device such as a motor. The abrasive cloth 6 comprises a polyurethane foam, a polyester, a nonwoven fabric or the like. The rotary wafer carrier 3 is for holding to carry the wafer 70 on the abrasive cloth 6 of the rotary table assembly 2 so that the rear surface of the wafer 70 faces to the abrasive cloth 6. The wafer carrier 3 can rotate on a shaft 8 at a predetermined rotation speed and horizontally move on the abrasive cloth 6 by an appropriate driving device such as a motor. During operation of the apparatus 1, the wafer 70 held by the wafer carrier 3 is in contact with the abrasive cloth 6 and proper loads L are applied to the wafer 70 in a downward direction through the shaft 8 and the wafer carrier 3. The abrasive liquid supplying member 4 is for supplying an abrasive liquid 9 on the abrasive cloth 6 to supply it between the wafer 70 and the abrasive cloth 6. The abrasive liquid 9 has an appropriate pH value and includes water and abrasive grains having a desired average diameter.

EXAMPLE 1

First, three wafer samples having a diameter of about 150 mm and a crystal orientation of <100>; three kinds of abrasive liquids of pH 5.0 which include abrasive grains having average diameters of 0.01 μm, 0.15 μm, and 4 μm, respectively, and water, wherein each average diameter was measured by direct observation method and each abrasive liquid contained 2% by weight of silica particles; and an abrasive cloth made of a polyurethane foam; were prepared.

After a wafer sample 70 was properly set to the rotary wafer carrier 3 of the above described apparatus 1 for inducing damage shown in FIG. 1, the rotary table assembly 2 and the wafer carrier 3 were rotated at predetermined speeds, supplying an abrasive liquid of pH 5.0 which include abrasive grains having average diameters of 0.01 μm, and thereby an induction of damage was carried out to the rear surface of the wafer sample. In this Example, the speed of revolution of the rotary table assembly 2 was about 160 rpm, the relative speed of the wafer 70 to the abrasive cloth 6 was 100 m/min, the pressure applied to the rear surface of the wafer 70 caused by the downward load L through the wafer carrier 3 was about 400 g/cm$^2$, and adjustment of pH value for the abrasive liquid 9 was performed by using a diluted hydrochloric acid, aqueous ammonia or the like. Consequently, a wafer having a damaged layer on the rear surfaces thereof was obtained.

Thereafter, by using the abrasive liquids of pH 5.0 including abrasive grains having average diameters of 0.15 μm and 4 μm, inductions of damage were carried out to the rear surface of the two rest wafer samples 70 by operating the above described apparatus 1, under approximately the same condition as that of use of the abrasive liquid including abrasive grains having average diameters of 0.01 μm. Consequently, two wafer samples having damaged layers on the rear surfaces thereof were obtained.

The surface densities of defect of the sample wafers on which three kinds of inductions of damage had been carried out were measured. The results are shown in Table 1 and FIG. 2.

TABLE 1

| AVERAGE DIAMETER OF SILICA PARTICLES | SURFACE DENSITY OF DEFECT |
| --- | --- |
| 0.01 μm | $1.5 \times 10^4$ cm$^{-2}$ |
| 0.50 μm | $1.8 \times 10^5$ cm$^{-2}$ |
| 3.50 μm | $2.1 \times 10^7$ cm$^{-2}$ |

Figure 2:
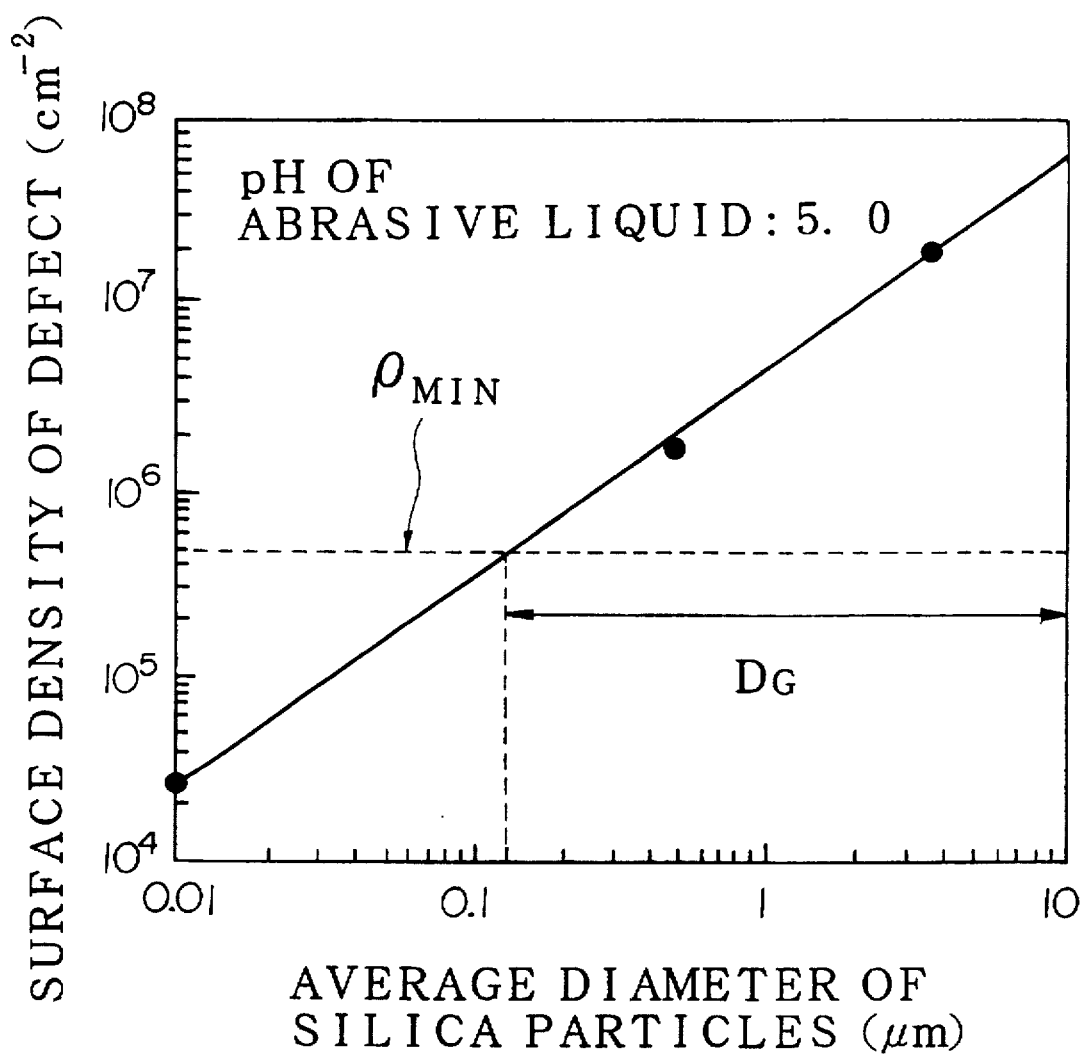
FIG. 2 is a graph showing the relationship between the average diameter of silica particles and the surface density of defect according to Example 1.

It is known that a surface defect density of about $5 \times 10^5$ cm$^{-2}$ is enough to bring on substantial gettering effect, by another experiment for finding the relationship between surface defect density and gettering effects. As shown in FIG. 2, it was found that when the pH of the abrasive liquid is 5.0, substantial gettering effects could be expected by using silica particles having an average diameter in the range of 0.1–10 μm. Silica particles having an average diameter not less than 10 μm were not used in this Example because of the aforementioned reason. In FIG. 2, $D_G$ indicates the range of average diameter of silica particles by which substantial gettering effects can be expected, and $\rho_{MIN}$ indicates the minimum value of the surface defect density by which substantial gettering effects can be expected.

EXAMPLE 2

First, three wafer samples having a diameter of about 150 mm and a crystal orientation of <100>; three kinds of abrasive liquids of pH 5, 8, and 11 which include abrasive grains having an average diameter of 3.5 μm, wherein each average diameter was measured by direct observation method and each abrasive liquid contained 2% by weight of silica particles; and an abrasive cloth made of a polyurethane foam; were prepared. Inductions of damage were carried out to the 3 wafer samples by the above apparatus 1 and by using the above 3 kinds of abrasive liquids and the abrasive cloth. In this Example, the speed of revolution of the rotary table assembly 2, the relative speed of the wafer 70 to the abrasive cloth 6, the pressure applied to the rear surface of the wafer 70, and the adjustment manner of pH value for the abrasive liquid 9 were the same as those of Example 1. Consequently, three wafer samples having damaged layers on the rear surfaces thereof were obtained.

The surface defect densities of the sample wafers on which 3 kinds of inductions of damage had been carried out were measured. The results are shown in Table 2 and FIG. 3.

Figure 3:
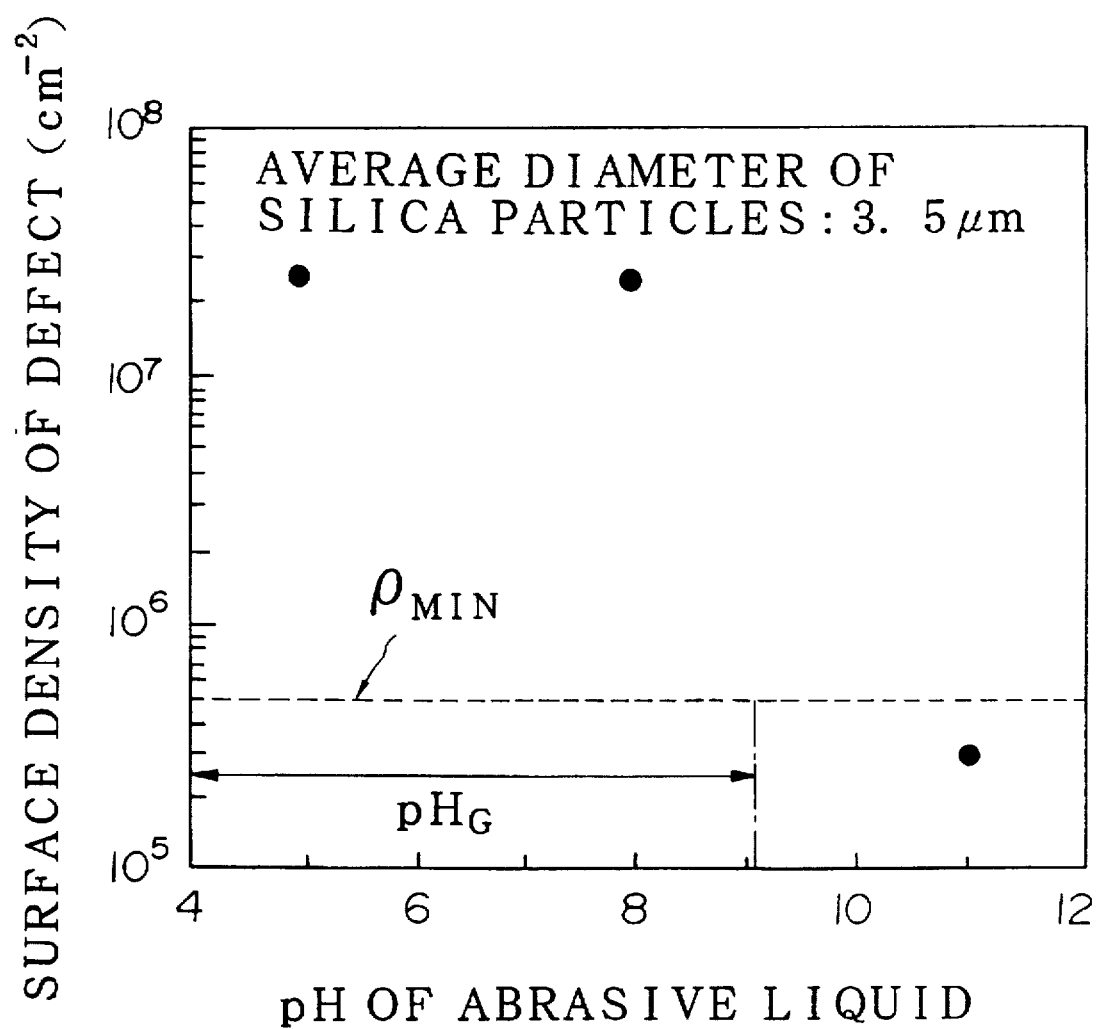
FIG. 3 is a graph showing the relationship between the pH of the abrasive liquid and the surface density of defect according to Example 2.

As shown in FIG. 3, it was found that when the average diameter of the silica particles contained in the abrasive liquid is 3.5 μm, substantial gettering effects could be expected by using the abrasive liquid of a pH in the range of 4–9. In FIG. 3, $pH_G$ indicates the range of pH of the abrasive liquid by which substantial gettering effects can be expected.

TABLE 2

| pH | SURFACE DENSITY OF DEFECT |
|---|---|
| 4.3 | $2.5 \times 10^7$ cm$^{-2}$ |
| 7.8 | $2.1 \times 10^7$ cm$^{-2}$ |
| 11.0 | $2.6 \times 10^5$ cm–2 |

EXAMPLE 3

First, a wafer sample having a diameter of about 150 mm and a crystal orientation of <100>; an abrasive liquid of pH 8.0 which includes water and abrasive grains having an average diameter of 0.50 μm, wherein the average diameter was measured by direct observation method and the abrasive liquid contained 2% by weight of silica particles; and an abrasive cloth made of a polyurethane foam; were prepared. Induction of damage was carried out to the wafer sample by the above apparatus 1 and by using the above abrasive liquid of pH 8.0 and the abrasive cloth made of a polyurethane foam. In this Example, the speed of revolution of the rotary table assembly 2, the relative speed of the wafer 70 to the abrasive cloth 6, the pressure applied to the rear surface of the wafer 70, and the adjustment manner of pH value for the abrasive liquid 9 were the same as those of Example 1. Consequently, a wafer sample having a rear surface which has a damaged layer and an extremely low dusting characteristics, was obtained.

Figure 5:
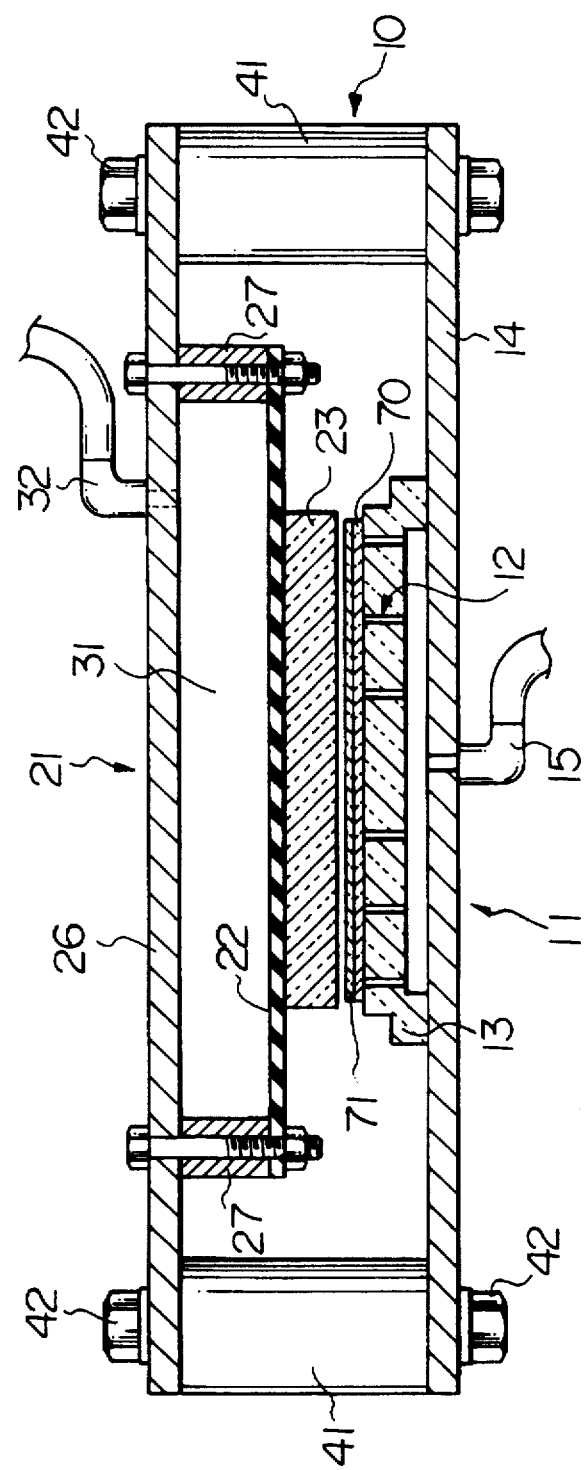
FIG. 5 is a vertically cross-sectional view for explaining an apparatus for evaluating the dusting characteristics of the rear surface of the wafer.

In order to evaluate the dusting characteristics of the wafer surface, an apparatus 10 as shown in FIG. 5 is used. Sample wafers 70 and reference wafers 71 are processed according to the steps shown in FIG. 6. Evaluation of the dusting characteristics is carried out by measuring particles transferred from the rear surface of the sample wafer 70 to a pressed surface of the reference wafer 71 by using a particle counter.

The construction of the apparatus 10 for evaluating the dusting characteristics of the wafer surface shown in FIG. 5 will be explained as follows.

The apparatus comprises a suction member 11 for sucking the wafer to fix thereon, and a pressing member 21 for pressing to adhere closely these wafers to each other.

The suction member 11 comprises a suction board 13, a rectangular metal substrate 14, and a nozzle 15. The suction board 13 comprises a circular plate made of ceramics, glass, or a rigid plastics, which has a plurality of suction holes 12 penetrating the suction board from the upper surface to the lower surface, and is attached to an upper surface of the substrate 14. The nozzle 15 is attached to the substrate 14. One end of the nozzle 15 is communicated with the suction holes 12 and the other end is communicated with a vacuum pump (not shown) through a pipe.

The pressing member 21 comprises a rectangular metal substrate 26, a ring-shaped body 27, a diaphragm 22 and a wafer pressing plate 23 attached to the lower surface of the diaphragm. The rectangular metal substrate 26, the ring-shaped body 27, and the diaphragm 22 having the wafer pressing plate 23 form a closed chamber 31 inside these members.

The diaphragm 22 is a circular sheet made of a flexible material. The wafer pressing plate 23 is a circular plate made of ceramics or glass and is attached on the diaphragm 22 concentrically by using an adhesive, an attachment or the like. The periphery of the diaphragm 22 is mounted to the end portion of the ring-shaped body 27 which is provided on the rectangular metal substrate 26. One end of a nozzle 32 is communicated with the closed chamber 31 and the other end is communicated with a compressor (not shown) through a pipe.

Rod-shaped or ring-shaped spacing members 41 are sandwiched between the suction member 11 and the pressing member 21. These members 11 and 21 are detachably mounted to the spacing members 41 by bolts 42. A reference wafer 71 and a sample wafer 70 are overlapped to each other and the overlapped wafers are sandwiched between the suction board 13 and the wafer pressing plate 23.

Material for conventional diaphragm valves can be used as a flexible material of the diaphragm 22. In particular, it is preferable to use a material of rubber system. Use of such a material enables pressing to adhere closely the reference and sample wafers to each other with a uniform pressure over the entirety of the pressed surfaces thereof.

Next, a summary of evaluation of the dusting characteristics by using the apparatus 10 shown in FIG. 5 will be explained. Wafers obtained by the method of the present invention and conventional wafers are used as the sample wafer 70, and mirror finished wafers obtained by a FZ method are used as the reference wafer 71.

Mirror polished surface of the reference wafer 71 prior to a pressurizing treatment are previously examined by using a particle counter LS-6000 which was manufactured by Hitachi Denshi Engineering Co. Ltd. Thereafter, a pressurizing treatment is carried out to the examined wafers and evaluation of the dusting characteristics is carried out according to the steps shown in FIG. 6.

In use of the apparatus shown in FIG. 5, first, the suction member 11 is removed from the apparatus body. A sample wafer 70 is placed on the upper surface of the suction board 13 so that the rear surface 60 of the wafer 70 to be evaluated faces the upper side, and is thereafter fixed to adhere to the suction board 13 by operating the vacuum pump. Next, a reference wafer 71 is laid on the sample wafer 70 so that the mirror finished surface 61 of the reference wafer 71 faces the rear surface 60 of the sample wafer 70. The suction member 11 with the attached wafers 70 and 71 is fixed to the apparatus body, as shown in FIG. 5.

Thereafter, compressed air is supplied into the closed chamber 31 from the compressor, so that the mirror finished surface 61 of the reference wafer 71 is pressed to the rear surface 60 of the sample wafer 70 at a pressure of 1 kgf/cm$^2$ and these wafers are closely adhered to each other, as shown in FIG. 6. After supply of the compressed air is stopped, the pressure is reduced by operating the vacuum pump so that the wafer pressing plate 23 separates apart from the reference wafer 71. Thereafter, the suction member 11 is removed from the apparatus body. The pressed mirror surface 61 of the obtained reference wafer 71 is examined by using the above-described particle counter LS-6000.

Evaluation of dusting characteristics of the rear surface of the sample wafer obtained by Example 3 and that of the rear surface of a conventional sand blast treated one were carried out by the apparatus shown in FIG. 5. Sample wafers and reference wafers were processed according to the above described steps shown in FIG. 6. Evaluation of the dusting characteristics was performed by measuring the number of foreign matters on the rear surfaces.

Figure 4:
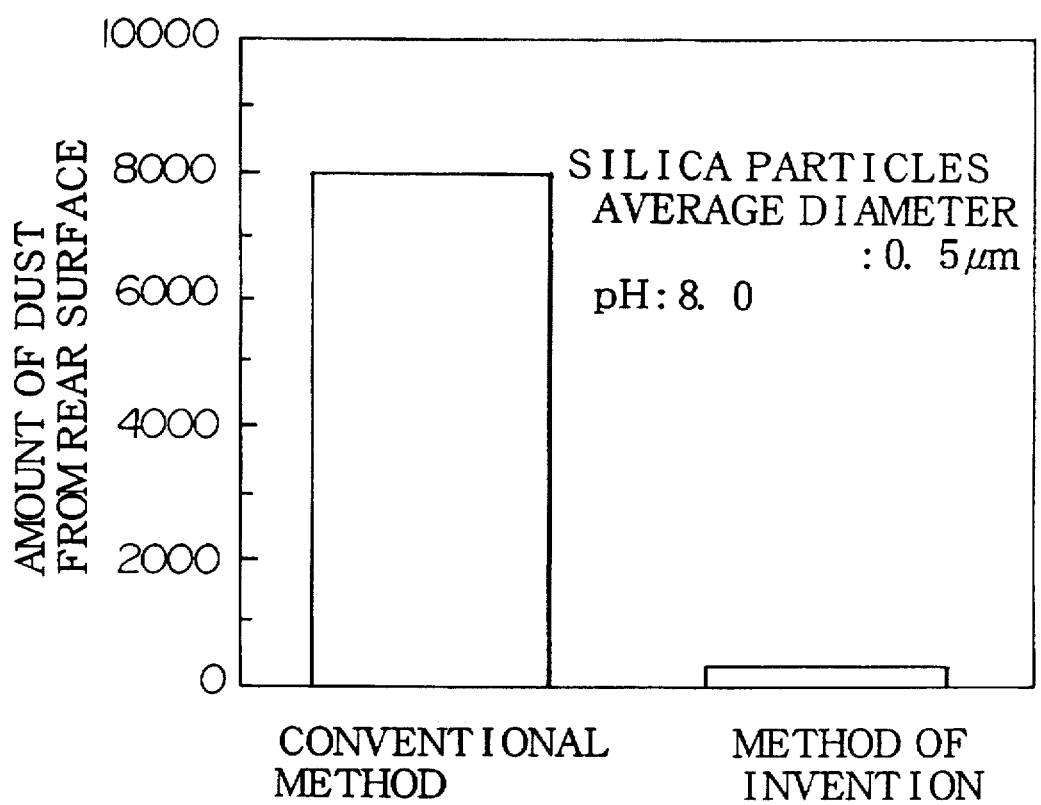
FIG. 4 is a graph showing dusting characteristics of the wafer on which an induction of damage according to the present invention was carried out and of the wafer on which a formation of damage according to a conventional sand blast method was carried out.

The measured number of foreign matters for the conventional sand blast treated one having a diameter of 150 mm was about 8000, and the measured number for the damage induced wafer having a diameter of 150 mm according to the present invention was about 205. The results are shown in FIG. 4. In the graph of FIG. 4, the ordinates indicate the number of foreign matters having a diameter not less than 0.10 µm on every 6-inch wafer.

From the results of Example 3, it was ascertained that when induction of damage according to the method of the present invention was performed, the dusting characteristics of the rear surface of the wafer thereof was extremely lower than that of the conventional sand blast treated one.

Although the present invention has been described in its preferred form with a certain degree of particularity, it should also be understood that the present invention is not limited to the preferred embodiment and that various changes and modifications may be made to the invention without departing from the spirit and scope thereof.

For example, in the above embodiment, only an apparatus for inducing damage of a single wafer processing type is disclosed, however, the method according to the present invention can be also applied to an apparatus for inducing damage of the so-called batch processing type, i.e., of a plurality of wafers processing type.

As described above, according to the present invention, it is possible to stably generate surface defects having a density of approximately up to $10^7$ cm$^{-2}$, higher than that of conventional method, therefore to provide excellent gettering effects to a wafer, and to depress dusting characteristics of the rear surface of the wafer.

What is claimed is:

1. A method for inducing damage for gettering to a rear surface of a single crystal silicon wafer by polishing the rear surface of the wafer, comprising the steps of:

moving the rear surface of the wafer on an abrasive cloth relatively, and damaging the rear surface of the wafer by supplying an abrasive liquid having a pH in the range of 4–9 which contains silica particles having an average diameter in the range of 0.1–10 µm as abrasive grains, between the rear surface of the wafer and an abrasive cloth during the moving, wherein the damaging effects gettering to capture impurities and point defects.

2. A method as claimed in claim 1, wherein the abrasive liquid has a pH in the range of 6–9.

3. A method as claimed in claim 1, wherein the abrasive liquid has a pH in the range of 7–9.

4. A method as claimed in claim 1, wherein the abrasive liquid consists essentially of water, the silica particles, and optional pH adjusting agents.

5. A method as claimed in claim 1, wherein the pH of the abrasive liquid is adjusted by using a diluted hydrochloric acid or an aqueous ammonia.

6. A method as claimed in claim 1, wherein the silica particles have an average diameter in the range of 0.5–4.0 µm.

7. A method as claimed in claim 1, wherein the silica particles have an average diameter in the range of 0.6–1.0 µm.

8. A method as claimed in claim 1, wherein the abrasive cloth comprises a polyurethane foam.

9. A method as claimed in claim 1, wherein the abrasive cloth comprises one selected from the group consisting of a polyester and a nonwoven fabric.

10. A method as claimed in claim 1, wherein the rear surface of the wafer is damaged to have a surface defect density of at least $5 \times 10^5$ cm$^{-2}$.

11. A method as claimed in claim 1, wherein the rear surface of the wafer is damaged to have a surface defect density on the order of $10^7$ cm$^{-2}$.

12. A method for inducing damage for gettering to a rear surface of a single crystal silicon wafer by polishing the rear surface, comprising the steps of:

rotating a rotary plate having an abrasive cloth attached thereon, rotating the wafer on the abrasive cloth so that the rear surface of the wafer can move on the abrasive cloth relatively, and damaging the rear surface of the wafer by supplying an abrasive liquid having a pH in the range of 4–9 which contains silica particles having an average diameter in the range of 0.1–10 µm as abrasive grains, between the wafer and the abrasive cloth during the rotating of the rotary plate and the wafer, wherein the damaging effects gettering to capture impurities and point defects.

13. A method for inducing damage for gettering to a rear surface of a single crystal silicon wafer by polishing the rear surface of the wafer, comprising the steps of:

moving the rear surface of the wafer on an abrasive cloth relatively, and damaging the rear surface of the wafer by supplying an abrasive liquid having a pH of not less than 4 and less than 8 which contains silica particles having an average diameter in the range 0.1–10 µm as abrasive grains between the rear surface of the wafer and the abrasive cloth during the moving, wherein the damaging effects gettering to capture impurities and point defects.

14. A method as claimed in claim 13, wherein the abrasive liquid has a pH not less than 6 and less than 8.

15. A method as claimed in claim 13, wherein the abrasive liquid has a pH not less than 7 and less than 8.

16. A method as claimed in claim 13, wherein the abrasive liquid consists essentially of water, the silica particles and optional pH adjusting agents.

17. A method as claimed in claim 13, wherein the pH of the abrasive liquid is adjusted by using a diluted hydrochloric acid or an aqueous ammonia.

18. A method as claimed in claim 13, wherein the silica particles have an average diameter in the range of 0.5–4.0 µm.

19. A method as claimed in claim 13, wherein the silica particles have an average diameter in the range of 0.6–1.0 µm.

20. A method as claimed in claim 13, wherein the abrasive cloth comprises a polyurethane foam.

21. A method as claimed in claim 13, wherein the abrasive cloth comprises one selected from the group consisting of a polyester and a nonwoven fabric.

22. A method for inducing damage for gettering to the rear surface of a single crystal silicon wafer by polishing the rear surface, comprising the steps of:

rotating a rotary plate having an abrasive cloth attached thereon, rotating the wafer on the abrasive cloth so that the rear surface of the wafer can move on the abrasive cloth relatively, and damaging the rear surface of the wafer by supplying an abrasive liquid having a pH not less than 4 and less than 8 which contains silica particles having an average diameter in the range of 0.1–10 µm as abrasive grains, between the wafer and the abrasive cloth during the rotating of the rotary plate and the wafer, wherein the damaging effects gettering to capture impurities and point defects.

* * * * *